US009760106B2

(12) United States Patent
Labrecque et al.

(10) Patent No.: US 9,760,106 B2
(45) Date of Patent: *Sep. 12, 2017

(54) INTEGRATED CIRCUIT HAVING REGULATED VOLTAGE ISLAND POWER SYSTEM

(71) Applicant: International Business Machines Corporation, Armonk, NY (US)

(72) Inventors: Donald W. Labrecque, Colchester, VT (US); Steffen A. Loeffler, Westborough, MA (US); Christopher P. Miller, Underhill, VT (US); Christopher Scoville, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/079,152

(22) Filed: Mar. 24, 2016

(65) Prior Publication Data
US 2016/0202717 A1    Jul. 14, 2016

Related U.S. Application Data

(63) Continuation of application No. 14/311,768, filed on Jun. 23, 2014, now Pat. No. 9,335,775.

(51) Int. Cl.
*G05F 3/02*     (2006.01)
*G11C 13/00*    (2006.01)
*G05F 1/66*     (2006.01)

(52) U.S. Cl.
CPC ............... *G05F 1/66* (2013.01); *G05F 3/02* (2013.01); *G11C 13/0004* (2013.01); *G11C 13/0038* (2013.01)

(58) Field of Classification Search
CPC ............ H01L 27/2096; H01L 27/0207; H01L 23/5221; H01L 23/528; G05F 1/66;
(Continued)

(56) References Cited

U.S. PATENT DOCUMENTS 6,091,609 A    7/2000 Hutson et al.
6,684,378 B2    1/2004 Yamamoto et al.
(Continued)

OTHER PUBLICATIONS

Notice of Allowance and Fee(s) Due for U.S. Appl. No. 14/311,768, dated Feb. 12, 2016, 5 pages.
(Continued)

*Primary Examiner* — Caridad Everhart
(74) *Attorney, Agent, or Firm* — Steven J. Meyers; Hoffman Warnick LLC

(57) ABSTRACT

Various embodiments include an integrated circuit (IC) structure having: a chip control logic; a chip power system connected with the chip control logic; and a voltage island connected with the chip control logic and the chip power system, the voltage island including: an interface component for interfacing with the chip power system and the chip control logic; a logic island connected with the interface component; and a voltage island power system connected with the interface component and the logic island, the voltage island power system independently controlling a voltage supplied to the logic island.

19 Claims, 2 Drawing Sheets

(58) Field of Classification Search
CPC ......... G05F 3/02; G05F 3/16; G11C 13/0004; G11C 13/0038
USPC .......................................... 257/207; 365/163
See application file for complete search history.

(56) References Cited

U.S. PATENT DOCUMENTS

| | | |
|---|---|---|
| 6,792,582 B1 | 9/2004 | Cohn et al. |
| 7,088,131 B1 | 8/2006 | Stout et al. |
| 7,831,935 B2 | 11/2010 | Bernstein et al. |
| 7,948,264 B2 | 5/2011 | Wang et al. |
| 9,335,775 B2* | 5/2016 | Labrecque ................ G05F 1/66 |
| 2005/0213280 A1* | 9/2005 | Azrai ...................... H01L 23/50 361/271 |
| 2006/184808 A1 | 8/2006 | Chua-Eoan et al. |
| 2009/0058504 A1 | 3/2009 | Goodnow et al. |
| 2009/0167093 A1* | 7/2009 | Nguyen .................... G06F 1/28 307/80 |
| 2009/0201082 A1 | 8/2009 | Smith et al. |
| 2010/0054074 A1* | 3/2010 | Ryu ....................... G11C 5/145 365/233.1 |
| 2013/0188434 A1* | 7/2013 | Puckett .................... G11C 7/00 365/189.16 |
| 2015/0318048 A1* | 11/2015 | Kasai ..................... G11C 16/08 365/185.18 |

OTHER PUBLICATIONS

Office Action for U.S. Appl. No. 14/311,768, dated Nov. 5, 2015, 12 pages.

\* cited by examiner

INTEGRATED CIRCUIT HAVING REGULATED VOLTAGE ISLAND POWER SYSTEM

BACKGROUND

The subject matter disclosed herein relates to semiconductor structures. More particularly, the subject matter relates to voltage islands in semiconductor structures.

As integrated circuit technologies have advanced, the size of these devices has correspondingly decreased. In particular, as devices are reduced in scale to comply with ever-smaller packaging, tighter constraints are applied to their dimensions and spacings.

Conventional integrated circuit (IC) structures utilize a central chip power system to power all chip logic, which includes chip control logic and special function logic. Because this central chip power system powers the control logic, it must be powered up all the time, and consequently, all other chip logic, including special function logic, must also be powered up all the time (even when not needed to perform any function).

Some types of ICs have multiple power systems, which can be dedicated to certain logic functions that are not used all the time. A dedicated power system for a logic function that is not used can be turned off or never powered up. This type of power management on an IC can be useful to reduce overall IC power consumption. One constraint of such an approach is the amount of time it takes to turn on a power system. Turning on such a power system can typically take microseconds to milliseconds before a desired voltage is established. This is a significant period of time for high-performance IC applications that still want to reduce power consumption, and as a result, this approach may be ineffective. Unfortunately, central power systems and multiple power systems may fail to respond to real-time power controls in the IC structure, causing inefficient usage and/or over-usage of power in the IC structure.

SUMMARY

Various embodiments include an integrated circuit (IC) structure having: a chip control logic; a chip power system connected with the chip control logic; and a voltage island connected with the chip control logic and the chip power system, the voltage island including: an interface component for interfacing with the chip power system and the chip control logic; a logic island connected with the interface component; and a voltage island power system connected with the interface component and the logic island, the voltage island power system independently controlling a voltage supplied to the logic island.

A first aspect includes an integrated circuit (IC) structure having: a chip control logic; a chip power system connected with the chip control logic; and a voltage island connected with the chip control logic and the chip power system, the voltage island including: an interface component for interfacing with the chip power system and the chip control logic; a logic island connected with the interface component; and a voltage island power system connected with the interface component and the logic island, the voltage island power system independently controlling a voltage supplied to the logic island.

A second aspect includes an integrated circuit (IC) structure having: a chip control logic; a chip power system connected with the chip control logic; and a voltage island connected with the chip control logic and the chip power system, the voltage island including: an interface component for interfacing with the chip power system and the chip control logic; a logic island connected with the interface component; a voltage island power system connected with the interface component and the logic island, the voltage island power system independently controlling a voltage supplied to the logic island, wherein the voltage island power system includes a standby regulator, wherein the voltage island power system is configured to switch the logic island between an off condition and an on condition, or vice versa, within approximately 30-70 nanoseconds; and a voltage island power net connected with the standby regulator, wherein the voltage island power net is configured to remain at least partially powered at all times during use of the IC structure, and wherein the standby regulator maintains at least approximately 0.1 volts to 0.5 volts of power to the voltage island power net during the use of the IC structure.

A third aspect includes a phase-change memory integrated circuit (IC) device having: a chip control logic; a chip power system connected with the chip control logic; and a voltage island connected with the chip control logic and the chip power system, the voltage island including: an interface component for interfacing with the chip power system and the chip control logic; a logic island connected with the interface component; and a voltage island power system connected with the interface component and the logic island, the voltage island power system independently controlling a voltage supplied to the logic island, wherein the voltage island power system is configured to switch the logic island between an off condition and an on condition, or vice versa, within approximately 30-70 nanoseconds.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
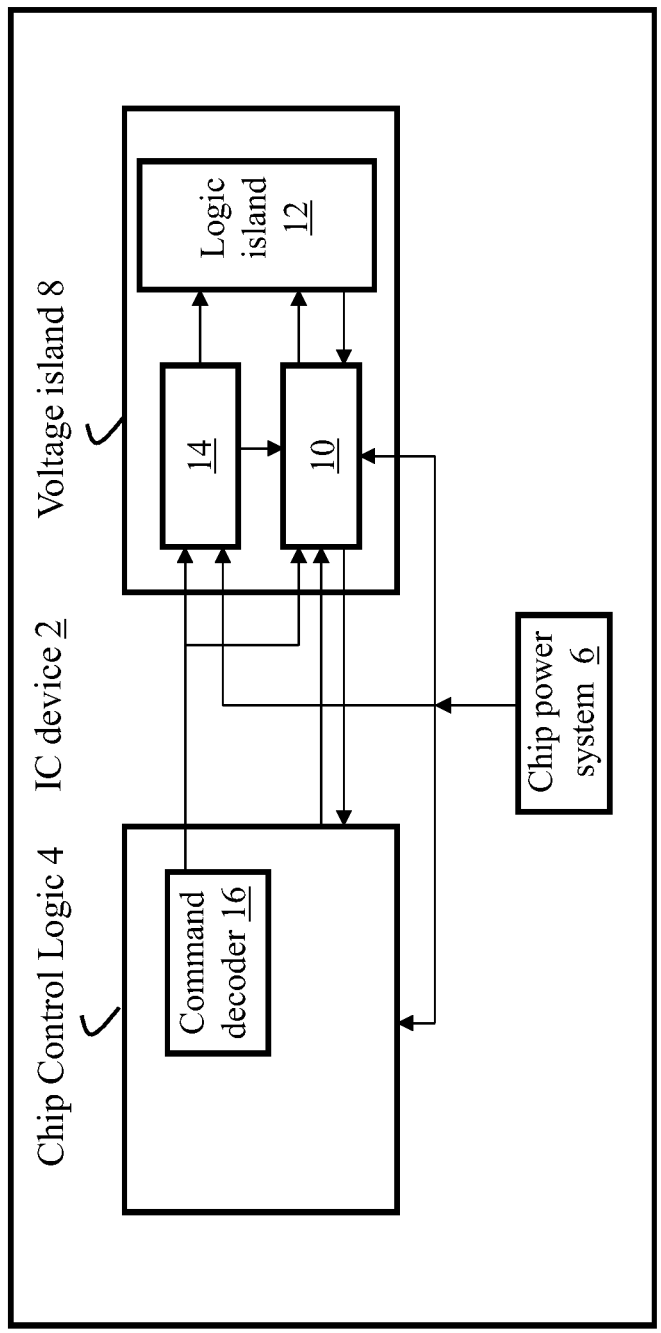
FIG. 1 shows a schematic depiction of an integrated circuit (IC) device according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit devices. More particularly, the subject matter relates to an integrated circuit (IC) device having a distinct power system within a voltage island to control power to a logic island.

As described further herein, the distinct power system in the voltage island allows precise control of the power supply to the logic island, allowing the logic island to be turned on/off quickly (e.g., in approximately 30-70 nanoseconds, and in some particular cases, 50 nanoseconds or less). Conventional circuit systems, utilizing only the central chip power system, require microseconds to turn a logic island on/off.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

FIG. 1 shows a schematic depiction of an integrated circuit (IC) structure 2 according to various embodiments. In some cases, as described herein, the IC structure 2 can include a phase-change memory (PCM) device. As shown, the IC structure 2 can include a chip control logic 4, a chip power system 6 connected with the chip control logic 4, and a voltage island 8 connected with the chip control logic 4 and the chip power system 6. The chip control logic 4 can include logic components configured to control operations of the IC structure 2, as is known in the art. The chip power system 6 can provide power to the chip control logic 4, and can include conventional chip power system components. The voltage island 8 can also draw power from the chip power system 6, and communicate with the chip control logic 4. As shown and further described herein, the voltage island 8 can include an interface component 10 for interfacing with the chip power system 6 (e.g., transferring power from the power system 6) and the chip control logic 4. The voltage island 8 can also include a logic island 12 connected with the interface component 10.

Additionally, in contrast to conventional IC devices including voltage islands, the voltage island 8 can further include a voltage island power system 14 connected with the interface component 10 and the logic island 12, where the voltage island power system 14 can independently control a voltage supplied to the logic island 12. That is, in contrast to conventional IC devices, the logic island 12 and the voltage island power system 14 are completely contained within the voltage island 8. As shown, the chip control logic 4 includes a command decoder 16 connected with the interface component 10 and the voltage island power system 14, where the command decoder 16 enables communication between the chip control logic 4 and the voltage island 8.

In various embodiments, the IC device 2, and in particular, the voltage island power system 14, is configured to switch the logic island 12 between an off condition and an on condition, or vice versa, within approximately 30-70 nanoseconds. As described further herein, this fast-switching capability makes the IC device 2 more dynamic than conventional IC devices, and allows for greater flexibility in use.

Figure 2:
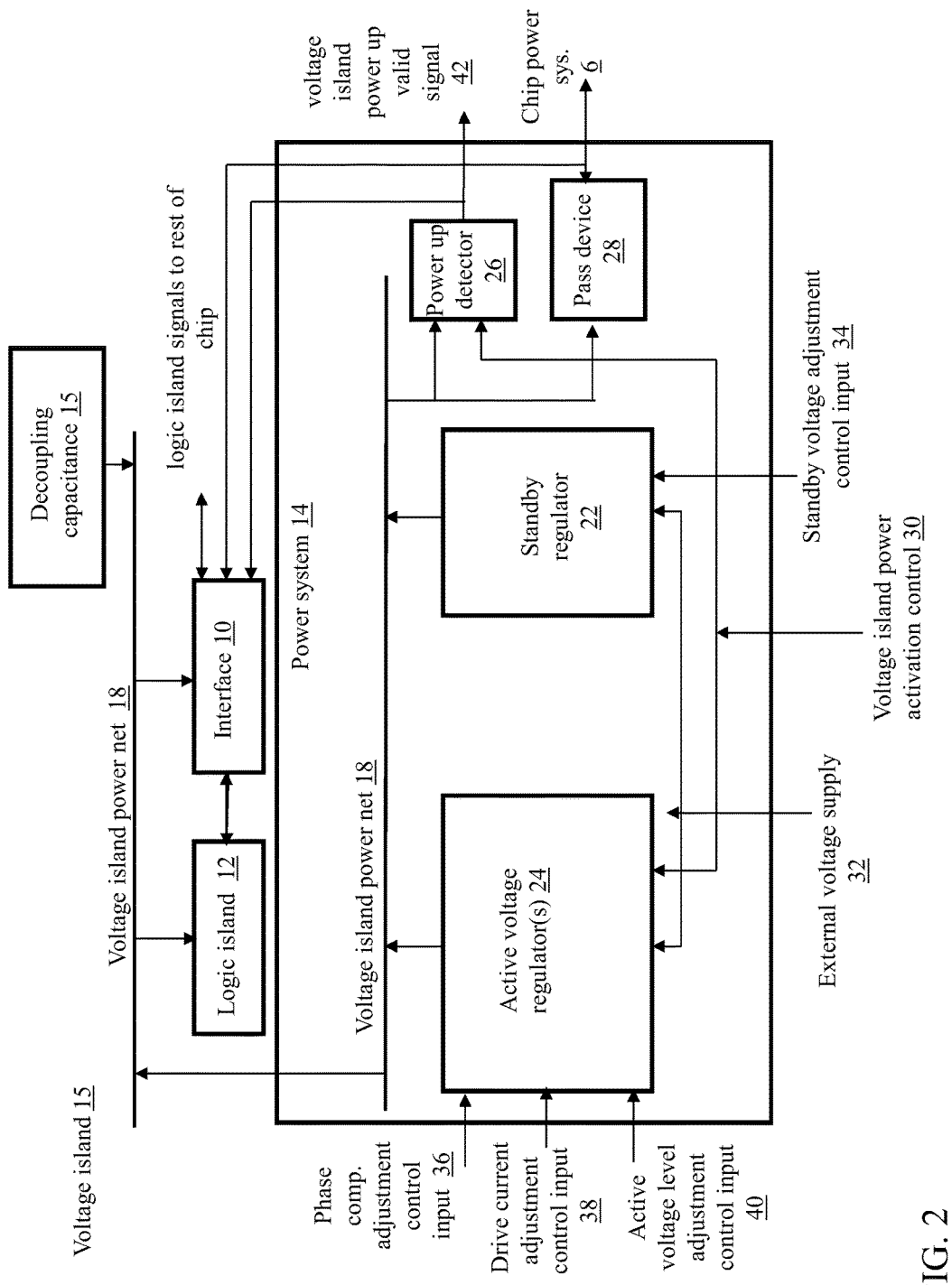
FIG. 2 shows a schematic depiction of a portion of the IC device of FIG. 1, according to various embodiments.

FIG. 2 shows a schematic depiction of a portion of the voltage island 8, and other components of the IC device 2 connected with the voltage island 8. With continuing reference to FIG. 1, FIG. 2 illustrates the voltage island 8 having a voltage island power net 18, which spans between the voltage island power system 14 (and its decoupling capacitance 15) and the logic island 12 and the interface component 10. As is further shown, the voltage island power system 14 can further include a standby regulator 22 connected with the voltage island power net 18. The standby regulator 22 can include a conventional standby regulator component for providing a standby regulated control voltage to the voltage island power net 18, as is known in the art. The voltage island power system 14 can further include an active voltage regulator (at least one) 24 connected with the standby regulator and the voltage island power net 18. The active voltage regulator 24 can include a conventional active voltage regulator component configured regulate the active voltage supplied to the voltage island power net 18, as described herein. The voltage island power net 18 is also connected to a power-up detector 26 and a pass device 28, where the pass device 28 is connected with the active voltage regulator(s) 24. The power-up detector 26 can include any conventional power-up detector components configured to detect a power-up to the voltage island power net 18. The pass device 28 can include one or more transistors (e.g., a series of p-type field-effect transistors, PFETs), and can make a connection between the voltage island power net 18 and the chip power system 6. This connection can be turned on or off via the pass device 28. The pass device 28 as described herein, can have similar capabilities to a multiplexor (mux) or switch gate, as these terms are known in the art. In various embodiments, the pass device 28 is implemented with a single transistor that can be turned on or off; however, in other cases, the pass device 28 is implemented as a set of parallel connected field effect transistors (FETs) that can be turned on or off either together or in a particular order/sequence. As shown, the voltage island 8 includes a voltage island power activation control device 30, which is connected with the active voltage regulator(s) 24, the power-up detector 26 and the pass device 28. The pass device 28 is further connected with the chip power system 6.

Additional components shown as included in the voltage island 8 include an external voltage supply 32 connected with the active voltage regulators 24 and the standby regulator 22, a standby voltage adjustment control input 34 connected with the standby regulator 22, and, connected with the active voltage regulator(s) 24, a phase compensation adjustment control input 36, a drive current adjustment control input 38, and an active voltage level adjustment control input 40. Further, connected with the power-up detector 22 is a voltage island power-up valid signal 42. While conventional active voltage regulators are designed with phase compensation and drive current set at a predetermined desired level (depending upon application), the active voltage regulator(s) 24 disclosed herein have settings that are adjustable via the control inputs (phase compensation adjustment control input 36, drive current adjustment control input 38, and active voltage level adjustment control input 40). These control inputs, as described herein, can be adjusted to set a desired rate for powering up the voltage island power net 18, and to control the amount of over-current injected onto the voltage island power net 18.

In some embodiments, the phase compensation adjustment control input 36 and the drive current adjustment control input 38 are adjusted to regulate the rate at which the voltage island power net 18 achieves the desired target voltage level, and can control the amount of over-current injected onto the voltage island power net 18 when the active voltage regulator(s) 24 is turned on to power up the voltage island power net 18.

As described herein, the IC structure 2, including the voltage island 8, can include benefits relative to conventional IC structures. In various embodiments, the voltage island power net 18 is configured to remain at least partially powered at all times during use of the IC structure 2, allowing for the quick-switching features described herein. That is, according to various embodiments, the standby regulator 22 maintains at least approximately zero (0) volts to approximately 0.8 volts, and in particular cases, 0.1 volts to 0.5 volts, of power to the voltage island power net 18 during the use of the IC structure 2. In some cases, the voltage island power activation control device 30 is configured to send a signal to the power-up detector 26 and the pass device 28 to control power to the voltage island 8 via the voltage island power net 18. In these cases, the power-up detector 26 is configured to detect a level of power in the voltage island power net 18.

In some embodiments, the pass device 28 allows for bleeding of over-current from the voltage island power net 18 after full charging of the active voltage regulator(s) 24. That is, according to various embodiments, the active voltage regulator(s) 24 are charged up, via the external voltage supply 32, and once fully charged, the pass device 28 bleeds current from the active voltage regulator(s) 24, via the voltage island power net 18. The pass device 28 can provide that bleed current out to the chip power system 6 for storage and/or later use in other components in the IC. Further, conversely, the pass device 28 can transmit current from the chip power system 6 to the voltage island power net 18 at any time when the active voltage regulator(s) 24 are not fully charged. That is, the pass device 28 can remain at least partially charged at all times in order to provide transitional power to the voltage island power net 18 while the active voltage regulator(s) 24 are not yet capable of providing that power. The voltage island power activation control device 30 can monitor an amount of power available from the active voltage regulator(s) 24, and can instruct (via signal) the active voltage regulator(s) 24 to provide power to the voltage island power net 18. At the same (or close to contemporaneous) time, the voltage island power activation control device 30 can instruct the pass device 28 to draw power from the chip power system 6 to give the voltage island power net 18 its required power during the transitional period (prior to full charging of active voltage regulator(s) 24). Additionally, the power-up detector 26 can provide information to the voltage island power activation control 30, and to the rest of the IC structure 2 (via voltage island power-up valid signal 42) that the voltage island power net 18 either is, or is not, powered up.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. An integrated circuit (IC) structure comprising:
   a chip control logic;
   a chip power system connected with the chip control logic; and
   a voltage island connected with the chip control logic and the chip power system, the voltage island including:
   an interface component for interfacing with the chip power system and the chip control logic;
   a logic island connected with the interface component; and a voltage island power system connected with the interface component and the logic island, the voltage island power system independently controlling a voltage supplied to the logic island, wherein the voltage island includes a voltage island power net, and wherein the voltage island power system further includes a standby regulator connected with the voltage island power net.

2. The IC structure of claim 1, wherein the chip control logic includes a command decoder connected with the interface component and the voltage island power system.

3. The IC structure of claim 1, wherein the logic island and the voltage island power system are completely contained within the voltage island.

4. The IC structure of claim 1, wherein the voltage island power system is configured to switch the logic island between an off condition and an on condition, or vice versa, within approximately 30-70 nanoseconds.

5. The IC structure of claim 1, wherein the voltage island power net is configured to remain at least partially powered at all times during use of the IC structure, and wherein the standby regulator maintains at least approximately 0.1 volts to 0.5 volts of power to the voltage island power net during the use of the IC structure.

6. The IC structure of claim 1, wherein the voltage island includes a voltage island power net, and wherein the voltage island power system includes a pass device and a power-up detector each connected with the voltage island power net.

7. The IC structure of claim 6, wherein the voltage island further includes a voltage island power activation control device, and wherein the voltage island power activation control device is configured to send a signal to the power-up detector and the pass device to control power to the voltage island via the voltage island power net.

8. The IC structure of claim 7, wherein the pass device is further connected with the chip power system, and wherein the pass device includes a transistor.

9. The IC structure of claim 8, wherein the power system further includes an active voltage regulator connected with the voltage island power net, the standby regulator, and the voltage island power activation control.

10. The IC structure of claim 9, wherein the pass device allows for bleeding of over-current from the voltage island power net after full charging of the active voltage regulator, and wherein the pass device provides transitional power to the voltage island power net while the active voltage regulator is not fully charged.

11. The IC structure of claim 9, wherein the active voltage regulator has a phase compensation adjustment control input and a drive current adjustment control input.

12. The IC structure of claim 11, wherein the phase compensation adjustment control input and the drive current adjustment control input control a rate at which the voltage island power net reaches full charging of the active voltage regulator and an amount of bleeding over-current on the voltage island power net.

13. An integrated circuit (IC) structure comprising:
a chip control logic;
a chip power system connected with the chip control logic; and
a voltage island connected with the chip control logic and the chip power system, the voltage island including:
an interface component for interfacing with the chip power system and the chip control logic;
a logic island connected with the interface component; and
a voltage island power system connected with the interface component and the logic island, the voltage island power system independently controlling a voltage supplied to the logic island,
wherein the voltage island includes a voltage island power net, and wherein the voltage island power system includes a pass device and a power-up detector each connected with the voltage island power net.

14. The IC structure of claim 13, wherein the voltage island further includes a voltage island power activation control device, and wherein the voltage island power activation control device is configured to send a signal to the power-up detector and the pass device to control power to the voltage island via the voltage island power net.

15. The IC structure of claim 14, wherein the pass device is further connected with the chip power system, and wherein the pass device includes a transistor.

16. The IC structure of claim 15, wherein the power system further includes an active voltage regulator connected with the voltage island power net, the standby regulator, and the voltage island power activation control.

17. The IC structure of claim 16, wherein the pass device allows for bleeding of over-current from the voltage island power net after full charging of the active voltage regulator, and wherein the pass device provides transitional power to the voltage island power net while the active voltage regulator is not fully charged.

18. The IC structure of claim 16, wherein the active voltage regulator has a phase compensation adjustment control input and a drive current adjustment control input.

19. The IC structure of claim 18, wherein the phase compensation adjustment control input and the drive current adjustment control input control a rate at which the voltage island power net reaches full charging of the active voltage regulator and an amount of bleeding over-current on the voltage island power net.

* * * * *